United States Patent [19]
Mori et al.

[11] Patent Number: 5,536,621
[45] Date of Patent: Jul. 16, 1996

[54] RAY-CURING BUTADIENE AND SUBSTITUTED LIQUID POLYBUTADIENE COMPOSITION

[75] Inventors: Takahiro Mori; Hiromichi Noguchi, both of Atsugi; Tadayoshi Inamoto, Machida, all of Japan

[73] Assignee: Canon Kabushiki Kaisha, Tokyo, Japan

[21] Appl. No.: 384,214

[22] Filed: Feb. 6, 1995

Related U.S. Application Data

[63] Continuation of Ser. No. 947,999, Sep. 21, 1992, abandoned, which is a continuation of Ser. No. 624,471, Dec. 10, 1990, abandoned, which is a continuation of Ser. No. 219,817, Jul. 15, 1988, abandoned, which is a continuation of Ser. No. 15,709, Feb. 17, 1987, abandoned.

[30] Foreign Application Priority Data

Feb. 14, 1986 [JP] Japan ................................. 61-28918

[51] Int. Cl.$^6$ .................................................. G03C 1/725
[52] U.S. Cl. ........................ 430/284.1; 522/98; 522/121
[58] Field of Search ...................... 522/121, 98; 430/284, 430/284.1

[56] References Cited

U.S. PATENT DOCUMENTS

| | | | |
|---|---|---|---|
| 3,607,977 | 9/1971 | Taylor | 260/876 |
| 3,764,324 | 10/1973 | Reyes | 96/35.1 |
| 4,020,125 | 4/1977 | Suzuki | 260/859 R |
| 4,117,036 | 9/1978 | Honda | 525/256 |
| 4,198,238 | 4/1980 | Scheve | 522/98 |
| 4,234,701 | 11/1980 | Abolins | 525/68 |
| 4,332,873 | 6/1982 | Hughes | 522/96 |
| 4,403,073 | 6/1983 | Ikeguchi | 525/374 |
| 4,429,076 | 1/1984 | Saito | 525/57 |
| 4,554,322 | 11/1985 | Kwiecinski | 525/245 |
| 4,572,610 | 2/1986 | Krajewski | 522/98 |
| 4,600,745 | 7/1986 | Creighton | 525/236 |
| 4,639,080 | 1/1987 | Kimura et al. | 525/315 |
| 4,688,052 | 8/1987 | Inamoto et al. | |
| 4,688,053 | 8/1987 | Noguchi et al. | |
| 4,688,054 | 8/1987 | Inamoto et al. | |
| 4,688,055 | 8/1987 | Noguchi et al. | |
| 4,688,056 | 8/1987 | Noguchi et al. | |
| 4,786,586 | 11/1988 | Lee | 522/182 |

FOREIGN PATENT DOCUMENTS

| | | |
|---|---|---|
| 614181 | 2/1961 | Canada . |
| 0098599 | 1/1984 | European Pat. Off. . |
| 2013216 | 8/1979 | United Kingdom . |

OTHER PUBLICATIONS

Roffey, "Photo Polymerization of Surface Coatings," John Wiley & Sons, 1982. pp. 162 & 163.

*Primary Examiner*—Mark Chapman
*Attorney, Agent, or Firm*—Fitzpatrick, Cella, Harper & Scinto

[57] ABSTRACT

An active energy ray-curing resin composition of (a) butadiene polymer having a number-average molecular weight of not less than about 10,000, and (b) a liquid polybutadiene having in the molecule 1.5 or more, on the average, of at least one of acryloyl group and methacryloyl group.

6 Claims, No Drawings

RAY-CURING BUTADIENE AND SUBSTITUTED LIQUID POLYBUTADIENE COMPOSITION

This application is a continuation, of application Ser. No. 07/947,999 filed Sep. 21, 1992, now abandoned, is a continuation of application Ser. No. 07/624,471, filed Dec. 10, 1990, now abandoned, which is a continuation of application Ser. No. 07/219,817, filed Jul. 15, 1988, now abandoned, which is a continuation of application Ser. No. 07/015,709, filed Feb. 17, 1987, now abandoned.

FIELD OF THE INVENTION AND RELATED ART

This invention relates to a resin composition which can be cured by irradiation of an active energy ray such as UV-ray, electron beam, or the like, and more particularly to an active energy ray curing type resin composition which is excellent in adhesion to a substrate made of glass, ceramics, plastic films or the like, which provides optimal chemical resistance and mechanical strength, and also has high sensitivity and resolution as a pattern forming material suitable for formation of a pattern comprising a cured film of high density. The active energy ray-curing type resin composition is a resin composition which can be formed into a solid photosensitive sheet (dry film). Recently, active energy ray curing resin compositions have been frequently used as coating materials, inks, sealing materials, resist materials and pattern forming materials. Although active energy ray-curing resin compositions as pattern forming materials have been used for initial preparation of printing plates, they have been recently utilized also for construction materials of precise instruments as in a fine fluid passage elements, in addition to utilization in the field of electronic industries such as printed or integrated circuits and printed or integrated circuits and the like.

In the fields mentioned above, the active energy ray-curing resin composition is generally used in the form of liquid application or in the form of a film (dry film type). If a liquid composition is used, the following advantage arise if the resin component is in solid state before application of the active energy ray:

(1) Thick films can be formed without difficulty;

(2) Processing time can be shortened because of the non-fluidability; and (3) Pattern formation is easy.

When the composition is used in the form of dry film, there are following advantages:

(1) A pattern having a uniform and accurate thickness can be produced;

(2) The processing is simple, and the pattern formation is easy; and (3) There is no significant volatile matter, and therefore, offensive odors can be reduced so that a workshop can be maintained under pleasant conditions.

However, the known active energy ray-curing resin compositions usable for pattern formation, particularly those of the dry film type, are mostly based on the curing property of acrylic esters, and involve a disadvantage that they are poor in adhesion to a substrate made of glass, ceramics or plastic films or the like. Additionally, those acrylic type dry films easily absorb water after being cured by irradiation of the active energy ray. Particularly, when they are contacted with alkaline liquid, their adhesion, mechanical strength, electrical insulativeness are remarkably deteriorated, which is considered to be caused by hydrolysis of the ester group. Therefore, durability is poor, when they are used for a protective coating or construction materials for fine instruments which require high mechanical strength and chemical resistance.

On the other hand, liquid polybutadiene is known as a curable material which exhibits good adhesion to a substrate made of glass, ceramics or plastic films or the like, high water resistance and high chemical resistance when formed into an applied film.

The main chain of the liquid polybutadiene consists only of hydrocarbon, and therefore, it is excellent in chemical resistance, water resistance and electric properties. Additionally, the molecule includes many ethylenic unsaturated bonds, so that cross-linking is easily accomplished in various manners. Noting those properties, it is widely used for paints, inks, bonding agents and insulative materials for electronic components. It is known that cross-linking of liquid polybutadiene is possible by irradiation of the active energy ray, but the curing speed is extremely low, and in addition, that it is difficult to form a pattern with high resolution. For this reason, it has been not possible heretofore to sufficiently utilize the benefit of the excellent properties of the cross-linked polybutadiene.

However, compositions using polybutadiene in the form of liquid are fluidable with the result of difficult film formation, and therefore, the pattern forming operations have been complicated.

In addition, it is also known that the cross-linking of polybutadiene is provided by the active energy-ray with the aid of an organic compound containing a diazido group. However, this method involves a problem such as production of pores within the film caused by the liberation of nitrogen gas from the diazido group when used as a thick resist, and therefore, it is difficult to provide a uniform resist.

SUMMARY OF THE INVENTION

An object of the present invention is to provide an active energy ray-curing resin composition which could not be accomplished by the active energy ray-curing resin of the prior art as described above, which is excellent in chemical resistance, water resistance, flexibility and adhesion to a substrate not only when used as a coating in liquid state on a substrate but also when used to be adhered in the form of dry film onto a substrate, and has a high sensitivity to an active energy ray and can form a precise and high resolution pattern.

Another object of the present invention is to provide an active energy ray-curing resin composition, which can be formed into a dry film which is convenient for formation of a pattern, and can also give a pattern formed by curing with irradiation of an active energy ray and optional heating treatment which is excellent in chemical resistance and mechanical strength, and also has high durability as the construction material.

According to the present invention, there is provided an active energy ray-curing resin composition comprising:

(1) a butadiene polymer having a number-average molecular weight of not less than about 10,000; and (b) at least one compound of liquid polybutadiene having in the molecule 1.5 or more, on the average, of at least one of acryloyl group and methacryloyl group.

According to the present invention, a particular combination of essential components for the active energy ray-curing resin composition is provided which is highly sensitive to and shows high resolution to the active energy ray; which is capable of providing a coating which is excellent in adhesion to a substrate made of glass, ceramics and plastic films or the like, chemical resistance and mechanical strength; and which is very useful for pattern forming material. It has been confirmed that the resin composition exhibits such excellence both in the form of liquid and in the form of dry film.

The first component is a butadiene polymer having a number-average molecular weight of not less than about 10,000, and known materials are usable to the present invention. For example, there are 1,2-polybutadiene; trans-1,4-polybutadiene; cis-1,4-polybutadiene; acrylonitrile-butadiene copolymer; styrene-butadiene copolymer. When the butadiene polymer has at both terminal ends functional group such as hydroxyl group or carboxyl group, it may have an extended chain by utilizing the functional group. For example, the polybutadiene having at both terminal ends the hydroxyl group or carboxyl group, may have an extended chain by using a diisocyanate compound or diepoxy compound or the like. Known diisocyanate compounds are usable for this purpose and preferably include hexamethylene diisocyanate; isophorone diisocyanate; methylene bis(4-phenyl isocyanate; xylylene diisocyanate; hydrogenated xylylene diisocyanate; methylene bis(4-cyclohexyl isocyanate), which are known.

Known diepoxy compounds are usable, and include preferably include, polyethylene glycol diglycidyl ether; polypropylene glycol diglycidyl ether; neopentyl glycol diglycidyl ether; 1,6-hexanediol diglycidyl ether; and methylene bis(4-cyclohexyl glycidyl ether), which are known.

The component (a) is required to have the number-average molecular weight of not less than about 10,000, and the preferable molecular weight is about 20,000–200,000. By using such a component (a), when, for example, the resin compound according to the present invention is used for a dry film, it is given a good property to maintain its shape as a solid film. In addition, the resultant pattern has high mechanical strength, chemical resistance and water resistance.

If the component (a) has the number-average molecular weight of less than 10,000, a dry film, into which it can be formed, cannot be easily supported on the substrate in a stabilized state. For example, it gradually flows, while it is rested, to produce wrinkles or to make the thickness uneven.

The component (b) is liquid polybutadiene having 1.5 or more, on the average, of (meth)acryloyl (this means acryloyl and/or methacryloyl).

The component (b) could be easily produced by the following methods (component (b) produced by another method is, of course, usable):

(a) Prepolymer having at both ends NCO group is produced by reaction between 1 mol of polybutadiene having hydroxyl group at both of the terminal ends and approx. 2 mols of diisocyanate, and the product is caused to react on hydroxyl containing (meth)acrylate:

(b) Polybutadiene having at both terminal ends carboxyl group is caused to react on (meth)acrylate having epoxy group; and (c) β-unsaturated carboxylic acid anhydride is subjected to on-addition to the position of tertiary carbon of 1,2-polybutadiene, which is then caused to react on hydroxyl-containing (meth)acrylate to produce half ester.

The diisocyanate compound usable in the above method is the same as described above. The (meth)acrylate compound having epoxy group includes, for example, glycidyl (meth)acrylate, glycidylethyl (meth)acrylate, glycidylbutyl-(meth) acrylate. As for the hydroxyl-containing (meth)acrylate compound, known ones are usable, including as preferable ones, 2-hydroxypropyl (meth)acrylate, 3-chloro-2-hydroxypropyl (meth)acrylate, 4-hydroxybuthyl (meth)acrylate, pentaerythritol monohydroxy tri(meth)acrylate, and dipentaerythritol-monohydroxy penta(meth)acrylate.

The number of the (meth)acryloyl groups in one molecule may be changed depending on selection of the material to be used. However, in order to achieve the object of the present invention, 1.5 or more (meth)acryloyl groups are preferable. If it is less than 1.5, the speed of cross-linking is not enough to provide satisfactory density of cross-linking, with the result of difficulty in forming a high resolution pattern. If, on the contrary, the number is too large, the flexibility of the coating becomes insufficient, which is not desirable. Accordingly, the number of the (meth)acryloyl groups per one molecule of the component (b) is preferably approx. 1.5–10.

It is preferable that the resin composition of the present invention contains 20–80% by weight of the component (a) and 80–20% by weight of component (b). If less than 20% by weight of component (a) is contained, the composition has low viscosity and shows fluidability prior to the curing, which requires careful handling; and in addition, the mechanical strength provided by the component (a) is insufficient, with the result of difficulty in using the resin composition as a structural member and a protection coating.

If, on the contrary, it is more than 80%, that is, the content of component (b) becomes too small, the cross-linking speed by the active energy ray decreases, and the cross-linking density is not sufficient, and therefore, high density and high resolution pattern cannot be formed. Most preferably, the resin composition comprises 30–70% by weight of the component (a) and 70–30% of the component (b).

The essential components of the resin composition according to the present invention are the above described components (a) and (b). Such a resin composition is easily cross-linked and cured by high energy rays such as electron beams. When, however, the curing is effected by UV-rays or infrared rays, it is preferable to add radical polymerization initiator.

Preferable radical polymerization initiator materials include benzyl benzophenone, benzoin isopropyl ether, and anthracene p-dimethylaminoacetophenone. However, another known light polymerization initiating material is usable. It is preferable to use, in addition to the above radical polymerization initiator, light polymerization promotor such as triethylamine and tributylamine.

When abundant cross-linking by unsaturated bond of polybutadiene is required, radical polymeriation initiator which can be activated by heat may preferably used, such as benzoyl peroxide, methyl isobutyl ketone peroxide, dicumyl peroxide, cumene hydroperoxide and tert-butyl cumyl peroxide, which are known.

It is preferable that the resin composition comprises about 0.1–20 parts by weight per 100 parts of total weight of the above described components (a) and (b).

Further, it is preferable that the resin composition comprises a monomer including ethylenic unsaturated bond in order to further promote the curing by the active energy-ray. By using such a monomer, the mechanical strength and the high resolution of the pattern can be provided.

As for the ethylenic unsaturated bond monomer, known vinyl monomer is usable, including styrene, methyl (meth)

acrylate, butyl (meth)acrylate, hexyl (meth)acrylate; pentaerythritol tetra(meth)acrylate, trimethylolpropane tri(meth)acrylate, dipentaerythritol tetra(meth)acrylate.

It is preferable that 1–100 parts by weight of the ethylenic unsaturated bond monomer per 100 parts of the total weight of the components (a) and (b). It is further preferable that if the number of (meth)acryloyl groups in the component (a) is relatively small, the amount of such a monomer is relatively large and vice versa. When the amount of the monomer is too large, the chemical resistance, water resistance and the mechanical resistance provided by the component (a) are degraded, although the cross-linking reaction speed becomes higher.

The active energy ray-curing resin composition according to the present invention may comprise another material, as required, as long as it does not obstruct achievement of the object of the present invention, for example, filler, colorant, plasticizer, antistatic agent, nonreactive polymer and organic solvent, depending on the respective purposes.

The active energy ray-curing resin composition according to the present invention may be in the form of liquid such as paints and inks or in the form of a film (dry film type) produced by suitable means. It is usable as paint, printing ink, and in addition, as pattern forming material as in printed circuits, integrated circuits or the like. The method per se of curing the liquid or solid resin composition may be of any kown type, such as electron beam generator, ultraviolet generator or the like, by which it is cured into a cured coating or a patterned coating.

The active energy ray to be used for curing of the active energy ray-curing resin composition of the present invention may include ultraviolet rays (UV-rays) or electron beams which have widely been practically applied. As the UV-ray light source, there may be employed high pressure mercury lamps, ultra-high pressure mercury lamps, metal halide lamps, etc., enriched in light with wavelength of 250 nm to 450 nm, preferably those which can give a light intensity of about 1 mW/cm$^2$ to 100 mW/cm$^2$ at the wavelength in the vicinity of 365 nm at a distance between the lamp and the material to be irradiated which is practically permissible. The electron beam irradiation device is not particularly limited, but a device having a dose within the range of 0.5 to 20M Rad is practically suitable.

When used as a pattern forming material, the resin composition according to the present invention shows high sensitivity and high resolution, and therefore, a pattern can be formed at high density with high resolution. The desired properties provided by butadiene polymer, i.e., the component (a) is sufficiently maintained so as to exhibit high mechanical strength, excellent adhesion to a substrate made of glass, ceramics and plastic film, without being deteriorated by the polybutadiene having (meth)acryloyl group, i.e., the component (b); simultaneously, the component (b) is effective to provide chemical resistance, water resistance and dimensional stability.

Accordingly, the resin composition according to the present invention is suitable for a protective coating and structure member requiring long term durability.

DESCRIPTION OF THE PREFERRED EMBODIMENTS

SYNTHESIS EXAMPLE 1

(1) Preparation of butadiene polymer having a number-average molecular weight (Mn) of not less than approx. 10,000:

In a three-necked flask, 200 g of 1,2-polybutadiene (Mn: 2,000) having hydroxyl group at both terminal ends was dissolved in 200 g of butyl acetate. Hydroquinone (0.1 g) was added thereto as a polymerization inhibitor. It was heated up to the temperature of 100° C. Using a dropping funnel, methylene bis(4-cyclohexylisocyanate) (total 26.2 g) was dropped thereinto for 10 hours. Further, stirring was effected for 10 hours at 100° C. to continue the reaction. It was confirmed by IR method that unreacted isocyanate compound disappeared. The resultant polymer liquid had high viscosity. The number-average molecular weight determined by GPC (gel permeation chromatography) method was 50,000, and the weight-average molecular weight was 190,000. It was confirmed that it became tack-free by evaporating the butyl acetate.

(2) Preparation of acryloyl polybutadiene:

In a three-necked flask, 70 g of 1,2-polybutadiene (Mn: 700) having hydroxyl group at both terminal ends was dissolved in 450 g of butyl acetate. Hydroquinone (0.05 g) was added as a polymerization inhibitor. It was heated up to the temperature of 90° C. Using a dropping funnel, methylene bis(4-cyclohexyl isocyanate) (total 52.4 g) was dropped thereinto for 5 hours. Further, stirring was effected for 5 hours at 90° C. to continue the reaction. It was confirmed by IR method that unreacted hydroxyl group disappeared.

To the thus provided both end isocyanated polybutadiene in liquid state, 2-hydroxyethyl acrylate (total 23.2 g) was dropped for 5 hours at 90° C. Further, stirring was effected for 5 hours at 90° C. It was confirmed by IR method that unreacted isocyanate group disappeared.

EXAMPLE 1

The butadiene polymer (60 g) provided by the process described in paragraph (1), the acryloyl polybutadiene (30 g) provided by the process of paragraph (2) and 1,2,4-trivinylcyclohexane (10 g) were dissolved in 400 g of methyl ethyl ketone. Benzophenone (5 g) and Michler's ketone (1 g) were added as a light polymerization initiator, and benzoyl peroxide (2 g) was added as a thermal polymerization initiator.

The thus provided liquid was applied on a surface of Si wafer having SiO$_2$ surface coating, and was dried. After being dried, the thickness was 30 microns. On the surface of the composition, a polyethylene terephthalate film having a thickness of 16 microns was laminated. It was exposed for 60 seconds through a resolution test mask to light emitted from a light source, for semiconductor manufacturing, of "Mask Aligner MA-10" available from Mikasa K.K., Japan, using a very high pressure mercury lamp with the center wavelength of approx. 365 nm and a light energy of 12 mW/cm$^2$ at the irradiated surface. After the exposure, it was developed for 2 minutes in an ultra sonics washer with a 1,1,1-trichloroethane developer.

The resolution after development was such that 50 microns of line width and line interval were reproduced. The substrate was dried by heat and was cured at 90° C. for 5 hours. A peel test was carried out, using a cellophane tape for industrial use, and any pattern was not peeled. The substrate was then dipped in an aqueous solution of sodium hydroxide (pH=9.0) and was subjected to a boiling test for 4 hours. After the boiling test, it was confirmed that the pattern was maintained adhered. Subsequently, another peel test was done, and no peeling occurred.

In addition, no denaturation such as whitening or blistering of the coating was recognized.

SYNTHESIS EXAMPLE 2

(1) Preparation of butadiene polymer having a number-average molecular weight (Mn) of not less than approx. 10,000:

In a three-necked flask, 150 g of 1,2-polybutadiene (Mn: 1,500) having carboxyl group at both terminal ends was dissolved in 180 g of butyl acetate. T-butylhydroquinone (0.07 g) was added thereto as a polymerization inhibitor. It was heated up to the temperature of 110° C. Using a dropping funnel, 1,6-hexanediol-diglycidyl ether (total 23 g) was dropped thereinto for 5 hours. Further, stirring was effected for 10 hours at 110° C. to continue the reaction. It was confirmed by IR method that unreacted epoxy group compound disappeared. The resultant polymer liquid had high viscosity. The number-average molecular weight determined by GPC (gel permeation chromatography) method was 4,500, and the weight-average molecular weight was 230,000. It was confirmed that it became tack-free by evaporating the butylacetate.

(2) Preparation of acryloyl polybutadiene:

In a three-necked flask, 100 g of 1,2-polybutadiene (Mn: 1,000) having carboxyl group at both terminal ends was dissolved in 400 g of butyl acetate. T-butylhydroquinone (0.1 g) was added as a polymerization inhibitor. It was heated upto the temperature of 100° C. Using a dropping funnel, glycidyl acrylate (total 25.6 g) was dropped thereinto for 5 hours. Further, stirring was effected for 5 hours at 90° C. to continue the reaction. It was confirmed by IR method that unreacted epoxy group disappeared.

EXAMPLE 2

The same process as with Example 1 was performed with the exception that the butadiene polymer (65 g) provided by the process described in paragraph (1), and acryloyl polybutadiene (20 g) provided by the process of paragraph (2), 1,2 polybutadiene (Mn: 1,500) (5 g) having carboxyl groups at both terminal ends, 1,4-divinylbenzene (5 g) and methacrylic acid (5 g), were dissolved in 400 g of methyl ethyl ketone.

The resolution after development was such that 50 microns of line width and line interval were reproduced. The substrate was dried by heat and was cured at 150° C. for 30 minutes. A peel test was carried out, using a cellophane tape for industrial use, and any pattern was not peeled. The substrate was then dipped in an aqueous solution of sodium hydroxide (pH=9.0) and was subjected to a boiling test for 4 hours. After the boiling test, it was confirmed that the pattern was maintained adhered. Subsequently, another peel test was done, and no peeling occurred.

In addition, no denaturation such as whitening or blistering of the coating was recognized.

SYNTHESIS EXAMPLE 3

(1) Preparation of butadiene polymer having a number-average molecular weight (Mn) of not less than approx. 10,000:

Same as with Synthesis Example 1.

(2) Preparation of acryloyl and methacryloyl polybutadiene:

In a three-necked flask, 100 g of 1,2-polybutadiene (Mn: 1000) having hydroxyl group at both terminal ends was dissolved in 450 g of butyl acetate. Hydroquinone (0.05 g) was added as a polymerization inhibitor. It was heated up to the temperature of 90° C. Using a dropping funnel, methylene bis(4-cyclohexyl isocyanate) (total 52.4 g) was dropped thereinto for 5 hours. Further, stirring was effected for 5 hours at 90° C. to continue the reaction. It was confirmed by IR method that unreacted hydroxyl group disappeared.

To the thus provided both end isocyanated polybutadiene in liquid state, 2-hydroxyethyl acrylate (total 11.6 g) and 2-hydroxyethyl methacrylate (13.0 g) were dropped for 5 hours at 90° C. Further, stirring was effected for 5 hours at 90° C. It was confirmed by IR method that unreacted isocyanate group disappeared.

EXAMPLE 3

The butadiene polymer (65 g) provided by the process described in paragraph (1), the acryloyl polybutadiene (25 g) provided by the process of paragraph (2) and 1,2,4-trivinyl-cyclohexane (10 g) were dissolved in 400 g of methyl ethyl ketone. The other processing was the same as with Example 1.

The resolution after development was such that 50 microns of line width and line interval were reproduced. The substrate was dried by heat and was cured at 150° C. for 30 minutes. A peel test was carried out, using a cellophane tape for industrial use, and any pattern was not peeled. The substrate was then dipped in an aqueous solution of sodium hydroxide (pH=9.0) and was subjected to a boiling test for 4 hours. After the boiling test, it was confirmed that the pattern was maintained adhered. Subsequently, another peel test was done, and no peeling occurred.

In addition, no denaturation such as whitening or blistering of the coating was recognized.

What is claimed is:

1. An active energy ray-curing resin composition, comprising:

(a) a butadiene polymer having a number-average molecular weight of at least about 10,000;

(b) a liquid polybutadiene having an average of at least 1.5 of at least one of the group consisting of acryloyl and methacryloyl, wherein the weight ratio of (a) to (b) is from about 20–80 to 80–20; and (c) a radical polymerization initiator activatible by an active energy ray in amounts from about 0.1 to 20 parts by weight per 100 parts by total weight of (a) and (b), wherein said active ray-curing resin composition is in solid form and is capable of being patterned with said active energy ray.

2. An active energy ray-curing resin composition, comprising:

(a) a butadiene polymer of a liquid polybutadiene reacted with a diisocyanate or a diepoxide, said butadiene polymer having a number-average molecular weight of at least about 10,000;

(b) a liquid polybutadiene having an average of at least 1.5 per molecule of (b) of at least one of the group consisting of acryloyl and methacryloyl, and wherein the weight ratio of (a) to (b) is from about 20–80 to 80–20; and (c) a radical polymerization initiator activatible by an active energy ray in amounts from about 0.1 to 20 parts by weight per 100 parts by total weight of (a) and (b), wherein said active ray-curing resin composition is in solid form and is capable of being patterned with said active energy ray.

3. An active energy ray-curing resin composition according to claims 1 or 2, further comprising a radical polymerization initiator which can be activated by heat, said radical polymerization initiator being present from about 0.1 to 15 parts by weight per 100 parts by total weight of (a) and (b).

4. An active energy ray-curing composition according to claims 1 or 2, further comprising an ethylenically unsaturated monomer, said monomer being present from about 1 to 100 parts by weight per 100 parts by total weight of (a) and (b).

5. An active energy ray-curing composition according to claim 1 or 2, wherein the weight ratio of (a) to (b) is from about 30–70 to 70–30.

6. An active energy ray-curing composition according to claim 5, wherein the number-average molecular weight of the butadiene polymer is between about 20,000–200,000.

* * * * *

UNITED STATES PATENT AND TRADEMARK OFFICE
CERTIFICATE OF CORRECTION

PATENT NO. : 5,536,621
DATED : July 16, 1996
INVENTOR(S) : TAKAHIRO MORI ET AL.

It is certified that error appears in the above-indentified patent and that said Letters Patent is hereby corrected as shown below:

COLUMN 1

Line 36, "printed or integrated circuits and" should be deleted;
Line 50, "are" should read --are the--;
Line 67, "strength," should read --strength, and--.

COLUMN 3

Line 15, "ends" should read --ends a--;
Line 27, "include" should be deleted;
Line 53, "ends" should read --ends an--;
Line 54, "having" should read --having a--;
Line 58, "ends" should read --ends a--;
Line 62, "on-addition" should read --an-addition--.

COLUMN 4

Line 53, "preferably" should read --preferably be--.

COLUMN 6

Line 2, "having" should read --having an--;
Line 18, "having" should read --having an--.

UNITED STATES PATENT AND TRADEMARK OFFICE
CERTIFICATE OF CORRECTION

PATENT NO. : 5,536,621
DATED : July 16, 1996
INVENTOR(S) : TAKAHIRO MORI ET AL.

It is certified that error appears in the above-indentified patent and that said Letters Patent is hereby corrected as shown below:

COLUMN 7

```
Line 7,   "having" should read --having a--;
Line 25,  "having" should read --having a--.
Line 28,  "upto" should read --up to--.
```

COLUMN 8

```
Line 4,   "having" should read --having an--;
Line 67,  "(b) of" should be deleted.
```

COLUMN 10

```
Line 8,   "claim" should read --claims--.
```

Signed and Sealed this

Fourth Day of February, 199'

Attest:

BRUCE LEHMAN

Attesting Officer    Commissioner of Patents and Trademarks